United States Patent
Ogure et al.

(10) Patent No.: US 6,709,555 B1
(45) Date of Patent: Mar. 23, 2004

(54) PLATING METHOD, INTERCONNECTION FORMING METHOD, AND APPARATUS FOR CARRYING OUT THOSE METHODS

(75) Inventors: Naoaki Ogure, Tokyo (JP); Akira Fukunaga, Tokyo (JP); Hiroshi Nagasawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/868,524

(22) PCT Filed: Oct. 17, 2000

(86) PCT No.: PCT/JP00/07181

§ 371 (c)(1),
(2), (4) Date: Jun. 19, 2001

(87) PCT Pub. No.: WO01/29283

PCT Pub. Date: Apr. 26, 2001

(30) Foreign Application Priority Data

Oct. 19, 1999 (JP) .......................... 11-296777
Dec. 2, 1999 (JP) .......................... 11-343400

(51) Int. Cl.⁷ .................. C25D 17/00; C25B 15/00; C25B 9/00; B05C 19/02
(52) U.S. Cl. .................. 204/224 R; 204/198; 204/241; 204/242; 204/274; 204/275.1; 118/423
(58) Field of Search .................. 205/109, 126; 118/423, 500, 503; 427/437; 204/242, 274, 198, 241

(56) References Cited

U.S. PATENT DOCUMENTS

| | | | | |
|---|---|---|---|---|
| 3,653,953 A | * | 4/1972 | Grant, Jr. et al. | 117/130 E |
| 3,671,597 A | * | 6/1972 | Kroll | 260/666 PY |
| 4,351,266 A | * | 9/1982 | Ando et al. | 118/425 |
| 4,622,917 A | * | 11/1986 | Schramm | 118/696 |
| 5,045,353 A | * | 9/1991 | Takada et al. | 427/243 |
| 5,633,208 A | | 5/1997 | Ishikawa | 438/699 |
| 5,868,917 A | * | 2/1999 | Benaben | 205/109 |
| 6,074,981 A | | 6/2000 | Tada | 502/224 |
| 6,165,598 A | | 12/2000 | Nelson | 428/212 |

FOREIGN PATENT DOCUMENTS

| | | |
|---|---|---|
| EP | 513 821 A2 | 11/1992 |
| JP | 52-142774 | 11/1977 |
| JP | 7-113178 | 5/1995 |
| JP | 10-056060 | 2/1998 |
| JP | 11-269656 | 10/1999 |

* cited by examiner

*Primary Examiner*—Donald R. Valentine
(74) *Attorney, Agent, or Firm*—Browdy and Neimark, P.L.L.C.

(57) ABSTRACT

The present invention relates to a plating method for use in forming a liner for plating in a conductor-embedding fine recess that is defined in a surface of a semiconductor substrate, and an interconnection forming method for use in forming an interconnection using such a liner, and characterized by reducing an organic metal compound in a non-aqueous solvent to plate a surface of a base material with metal. The plating method can easily be used similarly to an aqueous electroless plating process and is capable of forming a defect-free sound metal plated layer on the surface of a substrate which has a fine recess or the like for embedding a conductor therein, and the interconnection forming method is capable of forming an embedded interconnection that comprises a defect-free sound electric conductor in a fine recess.

13 Claims, 14 Drawing Sheets

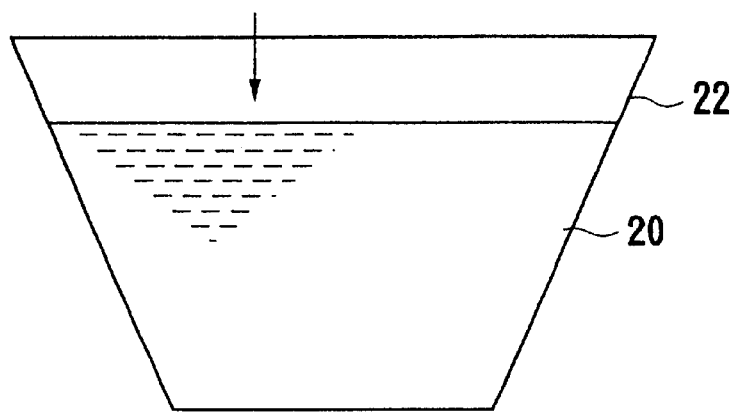
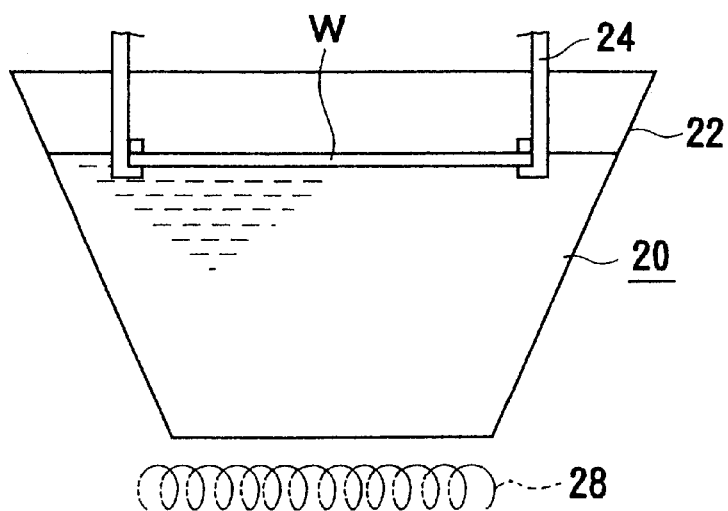
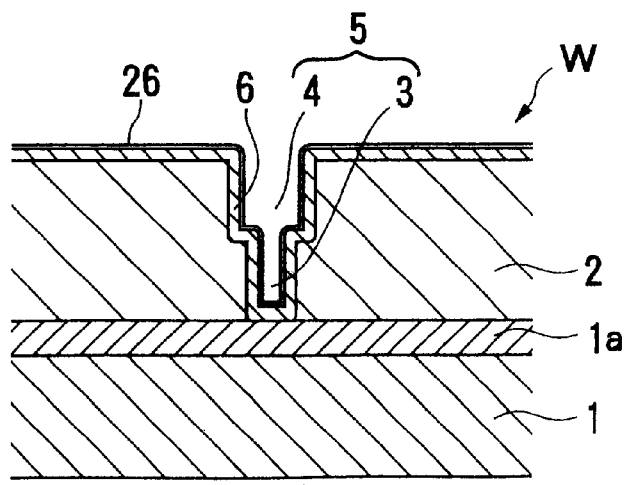

F I G. 3A
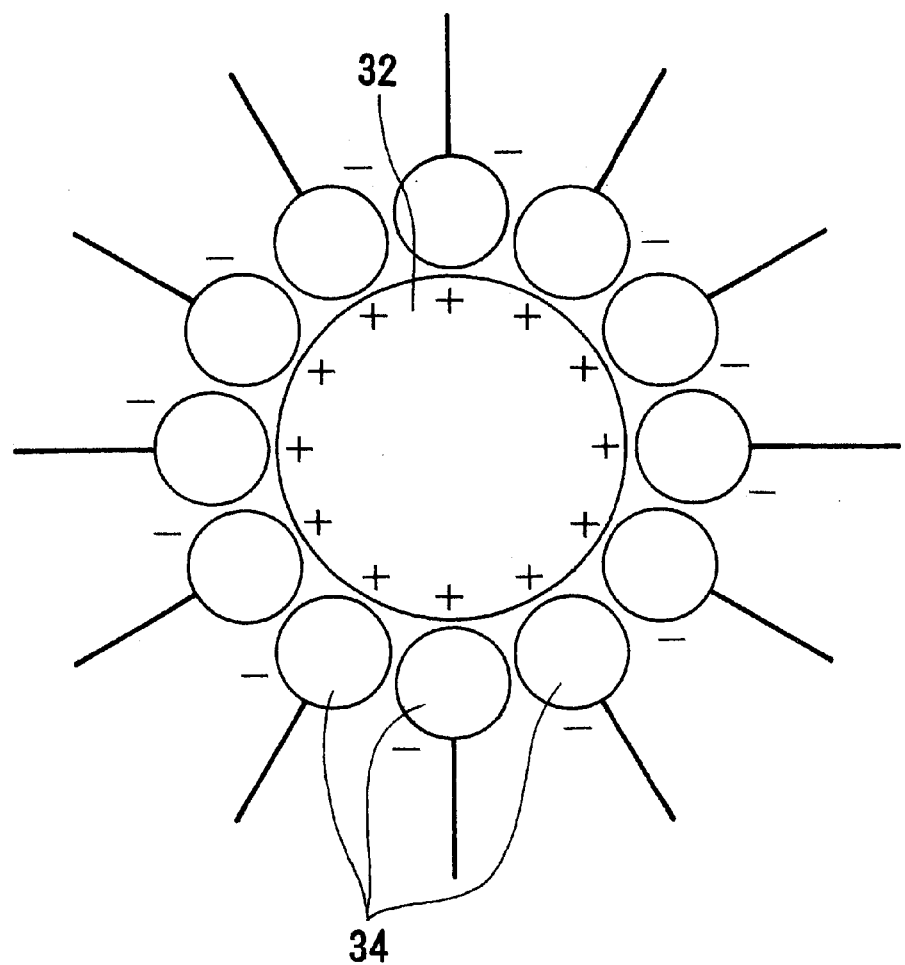
F I G. 3B
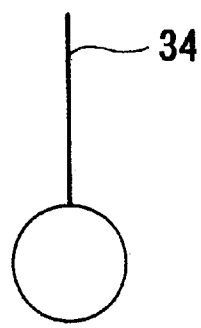

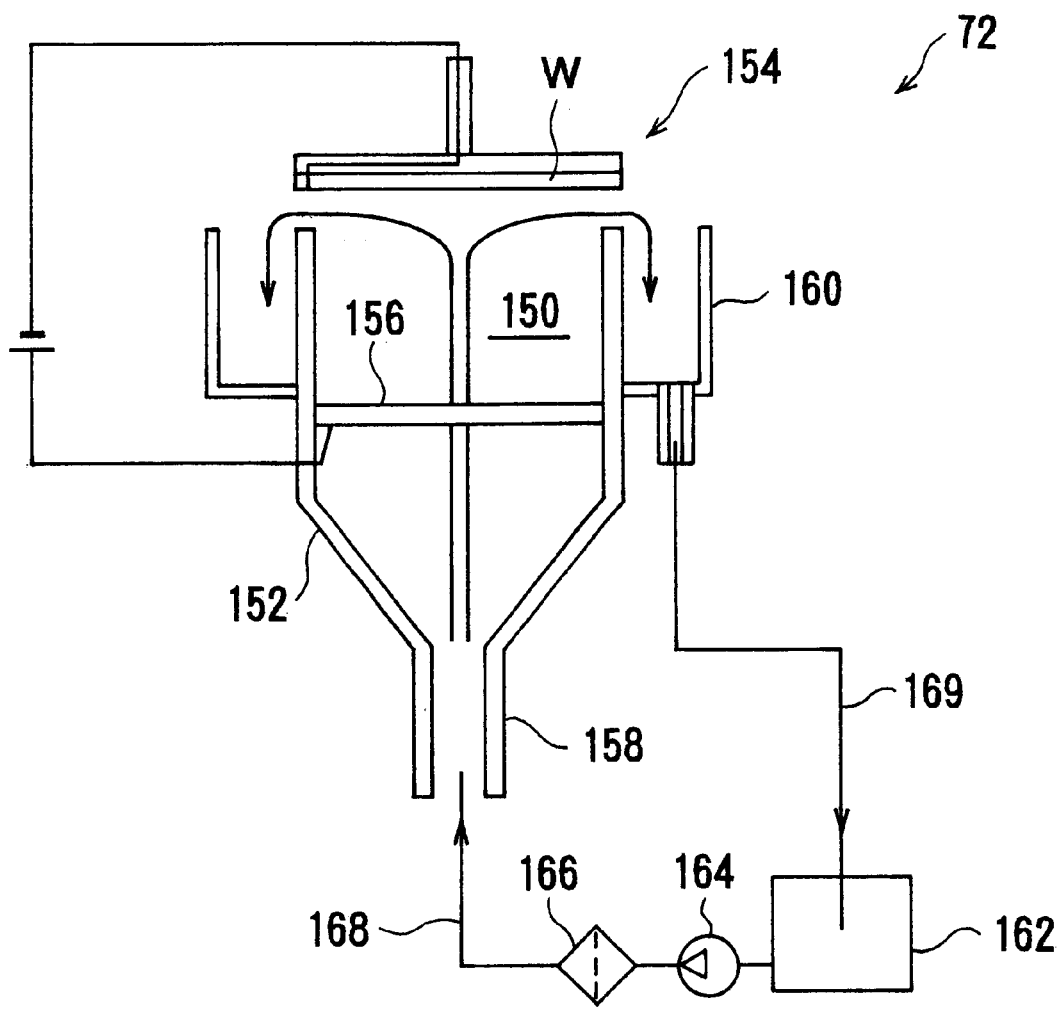
F I G. 1 2

PLATING METHOD, INTERCONNECTION FORMING METHOD, AND APPARATUS FOR CARRYING OUT THOSE METHODS

REFERENCE TO RELATED APPLICATIONS

The present application is the national stage under 35 U.S.C. §371 of international application PCT/JP00/07181, filed Oct. 17, 2000 which designated the United States, and which application was not published in the English language.

TECHNICAL FIELD

The present invention relates to a nonaqueous plating method for use in forming a liner for plating before an electrically conductive metal such as copper or the like is embedded by plating in a conductor-embedding fine recess that is defined in a surface of a semiconductor substrate, an interconnection forming method for use in forming an interconnection using such a liner, and apparatus for carrying out such methods.

BACKGROUND OF ART

Generally known plating processes include electroless and electrolytic plating processes which are carried out in an aqueous solution. However, some base materials to be plated are susceptible to water, and those base materials which have a hydrophobic surface or which are not electrically conductive are difficult or impossible to plate.

In view of the above difficulties, there have been developed and put to practical use various nonaqueous plating methods which do not use an aqueous solution. They include an evaporation plating process as a vacuum technology, a vapor-phase plating process based on sputtering or the like, a hot-dip plating process for dipping a workpiece in a molten metal, a thermal spraying process for applying a molten metal to a workpiece, a baking process based on the thermal decomposition of an organic metal, and a process using a mercury amalgam.

Aluminum or aluminum alloy has generally been used as a metal material for forming interconnection circuits on semiconductor substrates. In recent years, however, there has been a noticeable tendency to use copper as such a metal material. The reasons for using copper as an interconnection material are that copper is advantageous about a signal delay phenomenon as its electric resistivity is 1.72 $\mu\Omega$cm that is nearly 40% lower than the electric resistivity of aluminum, the electromigration resistance of copper is much higher than that of presently used aluminum, and it is easier to employ the dual damascene process on copper than on aluminum, resulting in a higher possibility to manufacture complex, fine multilayer interconnection structures relatively inexpensively.

There are available three processes for embedding a metal such as copper simultaneously in interconnection trenches and via holes according to the dual damascene principle, i.e., ① CVD, ② sputter reflow, and ③ plating. Of these processes, the plating process allows the metal to be embedded in fine recesses with good embeddability and has a strong tendency to form lines of good conductivity according to a relatively easy, inexpensive process. Therefore, it is becoming the common practice to incorporate the plating process in a semiconductor mass-production line to produce interconnections according to a design rule of at least 0.18 $\mu$m.

FIGS. 17A through 17C of the accompanying drawings show a basic process of plating a surface of a semiconductor substrate with copper to fabricate a semiconductor device with a copper interconnection. As shown in FIG. 17A, a semiconductor substrate W includes a semiconductor base 1 with a semiconductor device formed thereon, an electrically conductive layer 1a disposed on the semiconductor base 1, an insulating film 2 of $SiO_2$ deposited on the electrically conductive layer 1a and having a fine recess 5 which comprises a contact hole 3 and an interconnection trench 4 defined therein by lithography and etching, and a barrier layer 6 of TaN or the like deposited on the surface formed so far.

As shown in FIG. 17B, the surface of the semiconductor substrate W is plated with copper to fill copper 7 in the recess 5 in the semiconductor base 1 and deposit copper 7 on the barrier layer 6. Thereafter, the assembly is chemically and mechanically polished (CMP) to remove the copper 7 on the barrier layer 6 and also the barrier layer 6 until the surface of the copper 7 filled in the contact hole 3 and the interconnection trench 4 lies substantially flush with the surface of the insulating film 2. In this manner, an embedded interconnection of the copper 7 is formed as shown in FIG. 17C.

For embedding the copper 7 in the recess 5 defined in the surface of the semiconductor base 1 according to the electrolytic plating process, for example, it is widely practiced to form a liner (undercoat film) 8, which will serve as a seed layer, on the surface of the barrier layer 6 on the semiconductor substrate W before the copper is plated, as shown in FIG. 18A. The liner (seed layer) 8 is deposited for the primary purpose of supplying a sufficient electric current to reduce metal ions in the electrolytic liquid using the surface of the seed layer as an electric cathode, so that the reduced metal ions are precipitated as a metal solid. When the electroless plating process is employed, then it is the wide practice to deposit a catalytic layer in place of a seed layer, as the liner 8.

Presently, the conventional nonaqueous plating methods find limited applications, however, because they need special vacuum equipment, require base materials for plating to be heat-resistant, and are difficult to produce accurate plated films.

Generally, the liner 8 is often formed by sputtering. However, the growth of the liner 8 by sputtering makes it difficult to form the liner 8 that covers the entire surface of the recess 5 as the recess 5 becomes narrower and deeper. For example, if the width $W_1$ of the opening of the recess 5 is 0.25 $\mu$m, then it is thought that the limit depth D of the recess 5 for forming a sound liner 8 on the entire surface of the recess 5 according to sputtering film growth is about 1.25 $\mu$m.

If the depth of the recess 5 exceeds the limit depth D, then, as shown in FIG. 18A, only an incomplete film is formed on the side walls of the fine recess 5 defined in the surface of the substrate W. Furthermore, when the surface which faces the plasma, while the sputtering process is being carried out, is heated to the limit temperature, sputtering copper molecules are coagulated into precipitated granules 9, which inhibit the formation of a continuous film.

If an attempt is made to embed a metal according to electrolytic plating on the incomplete liner, then the plated metal grows in equal directions at equal rates from sound electrically conductive surfaces of the liner 8, but is restrained or prevented from growing from defective regions of the liner 8. As a result, a void 10 is produced in the copper 7 that is finally embedded in the recess 5, as shown in FIG. 18B, or a large cavity (plating failure) 11 is produced in the copper 7 that is finally embedded in the recess 5, as shown in FIG. 18C.

If the thickness of the liner 8 is increased to a value much greater than the normal thickness to greatly increase the area covered by the liner 8 in order to avoid the above drawbacks, as shown in FIG. 19A, then overhanging regions 12 project to a large extent from shoulders of the opening of the recess 5. When the assembly is plated, the path extending across the entrance of the recess 5 is quickly reduced and closed as the plating process is in progress. As a consequence, copper ions supplied into the recess 5 become unavailable in the plating process, leaving the plating liquid. Therefore, as shown in FIG. 19B, a seam 13 often occurs as a thin slit-like defect in the copper 7 embedded in the recess 5.

The void 10, the cavity 11, and the seam 13, which are plating defects, are extremely harmful to the electrically conductive path. It is thus desirable to eliminate those defects and produce a continuous integral electrically conductive path for achieving a sufficient current capacity, suppressing a signal delay, and improving the electromigration resistance. This also holds true for the electroless plating process which uses a catalytic layer as the liner in place of a seed layer in the electrolytic plating process.

DISCLOSURE OF INVENTION

The present invention has been made in view of the above disadvantages and demands. It is an object of the present invention to provide a plating method which can easily be used similarly to an aqueous electroless plating process and is capable of forming a defect-free sound metal plated layer on the surface of a substrate, for example, which has a fine recess or the like for embedding a conductor therein, and an interconnection forming method which is capable of forming an embedded interconnection that comprises a defect-free sound electric conductor in a fine recess.

According to the present invention there is provided a plating method characterized in that a surface of a base material is plated with metal by reducing an organic metal compound in a nonaqueous solvent.

With this method, a solution is prepared by dissolving an organic metal compound containing a metal to be plated in a nonaqueous organic solvent, and the organic metal compound is reduced in the solution to precipitate the metal contained in the organic metal compound on the surface of the base material to plate the base material with the metal.

Also according to the present invention, in the aforementioned plating method, the reduction of the organic metal compound is carried out by a self-reduction decomposing reaction of the organic metal compound with heat.

If the organic metal compound is reduced by being self-decomposed at a low temperature, a solution is prepared by dissolving the organic metal compound in a nonaqueous organic solvent having a boiling point higher than the self-decomposing reduction temperature of the organic metal compound, and the solution is heated to a temperature equal to or higher than the self-decomposing reduction temperature of the organic metal compound in the presence of the base material to be plated for thereby generating a metal film on the surface of the base material.

Also according to the present invention, in the plating method described above, the reduction of the organic metal compound is carried out using a reducing agent.

The reducing agent may comprise an alcohol such as methanol, ethanol, or the like, grape sugar, ascorbic acid, hydrazine, acetaldehyde, or the like.

According to another aspect of the present invention, the base material comprises a substrate with a fine recess, for filling a conductor therein, formed in a surface thereof, and the substrate is plated with metal to form a liner for plating on the surface of the substrate.

The solution with the organic metal compound dissolved in the solvent enters the conductor-embedding fine recess in the surface of the substrate easily and reliably, so that a defect-free and sound liner can be formed on the surface of the substrate including the inner surfaces of the recess.

According to a further aspect of the present invention, there is provided a method of forming an interconnection, comprising electrolytically plating the surface of the substrate after forming the liner by a plating a indicated above and chemical mechanical polishing the surface of the substrate to remove excessive metal attached thereto.

With the above method, interconnections can easily be formed by so-called single- and dual-damascene processes.

According to an yet another aspect of the present invention, there is provided a method of forming an interconnection by filling an electrically conductive metal in a fine recess formed in a surface of a base material with plating, comprising of supplying an ultrafine particle dispersed liquid comprising ultrafine metal particles dispersed in a solvent to the surface of the base material and baking the ultrafine particle dispersed liquid to form a liner, electrolytically plating the surface of the base material, and chemical mechanical polishing the surface of the base material to remove excessive metal attached thereto.

With the above method, by uniformly mixing and dispersing ultrafine metal particles in a solvent, and baking and decomposing all the organic material in the solvent, it is possible to form a good liner for plating which has uniformly covered the entire surface of the base material including side walls of the fine recess.

According to an a still further aspect of the present invention, the ultrafine metal particles have an average diameter ranging from 1 to 20 nm.

It is known that the melting point of a metal particle is lowered as the diameter thereof is reduced. This effect starts to manifest itself when the diameter of the metal particle is 20 nm or less, and becomes distinctive when the diameter of the metal particle is 10 nm or less. Therefore, the average diameter of the ultrafine metal particles are preferably in the range from 1 to 20 nm, and preferably in the range from 1 to 10 nm depending on the shape and dimensions of the fine recesses and the structure of the semiconductor device.

The ultrafine metal particles comprise ultrafine silver particles produced by thermally decomposing an organic complex containing silver. The ultrafine silver particles are fabricated by heating silver stearate in a nitrogen atmospnere at about 250° C. for 4 hours, and then refining the same. Ultrafine particles such as manufactured by an in-gas evaporation process may also be used.

The base material desirably comprises a semiconductor substrate, and the electrically conductive metal comprises copper.

According to another aspect of the present invention, there is provided a semiconductor device characterized in that the base material has an interconnection formed by a method as described above.

Also according to the invention, there is provided a plating apparatus comprising a container for holding a solution prepared by uniformly dissolving an organic metal compound having a metal to be plated in a nonaqueous organic solvent and adding a reducing agent, and a substrate holder for holding a substrate and dipping a surface, to be plated, of the substrate in the solution held by the container.

There is also provided a plating apparatus comprising a container for holding a solution prepared by dissolving an organic metal compound having a metal to be plated in a nonaqueous organic solvent having a boiling point higher than the self-decomposing reduction temperature of the organic metal compound, a heating device for heating the solution to a temperature equal to or higher than the self-decomposing reduction temperature of the organic metal compound, and a substrate holder for holding a substrate and dipping a surface, to be plated, of the substrate in the solution held by the container.

Also provided according to the present invention is an apparatus for forming an interconnection, comprising a liner forming device for forming a liner on a surface of a substrate having a fine recess formed therein by reducing an organic metal compound in a nonaqueous solvent, and an electrolytic plating device for electrolytically plating the surface of the substrate using the liner.

An apparatus for forming an interconnection is also provided, comprising a liner forming device for forming a liner on a surface of a substrate having a fine recess formed therein by supplying an ultrafine particle dispersed liquid comprising ultrafine metal particles dispersed in a solvent to the surface of the substrate, and by baking the ultrafine particle dispersed liquid, and an electrolytic plating device for electrolytically plating the surface of the substrate using the liner.

The liner forming device desirably has a dispersed liquid supply device for supplying the ultrafine particle dispersed liquid to the surface of the substrate, and a heat-treating device for heating the substrate to melt and bond the metal.

The liner forming device also desirably further comprises a supplementary drying device for supplementarily drying the solvent in the ultrafine particle dispersed liquid supplied to the surface of the substrate.

With this arrangement, it is possible to completely dry up an organic solvent which cannot be fully dried up by a spin drying process (air drying process) using a spin coater or the like, thus preventing voids from being formed in a heating process.

An apparatus according to the present invention may further comprise a polishing device for chemical mechanical polishing the surface of the substrate to remove excessive metal attached thereto. Also, the respective devices are desirably sequentially arranged in an indoor facility along a direction in which the substrate moves.

The steps of forming a liner of metal, plating the substrate, and chemical mechanical polishing the substrate require different periods of time. It is thus preferable to optimize these steps as a whole according to a feedback management process for feeding back information of those steps with computers. With the devices for performing those steps being housed in one case, the operations of the steps can successively be carried out.

In addition, the respective devices are desirably accommodated individually in respective chambers disposed radially around a central transfer chamber with a transfer robot disposed therein.

Therefore, the steps of forming a liner of metal, plating the substrate, and chemical mechanical polishing the substrate which require different periods of time can be optimized as a whole in an organic fashion and combined, yet performed individually, according to the feedback management process for feeding back information of those steps with the computers.

BRIEF DESCRIPTION OF THE DRAWINGS

FIGS. 1A–1C are schematic views showing steps of a plating method (a method of forming an interconnection) according to an embodiment of the present invention;

FIGS. 3A–3B are views schematically showing the structure of an ultrafine particle as a material used in the method shown in FIG. 2;

FIG. 12 is a schematic view of a plating device of the apparatus for forming an interconnection according to the present invention;

BEST MODE FOR CARRYING OUT THE INVENTION

An embodiment according to the present invention will be described below with reference to the drawings. The embodiment will be used as one type of a so-called dual-damascene process for forming interconnections of copper or silver layer in fine recesses such as interconnection trenches defined in the surface of a semiconductor substrate and vertical holes, referred to as contact holes, that interconnect layers.

Figure 17A:
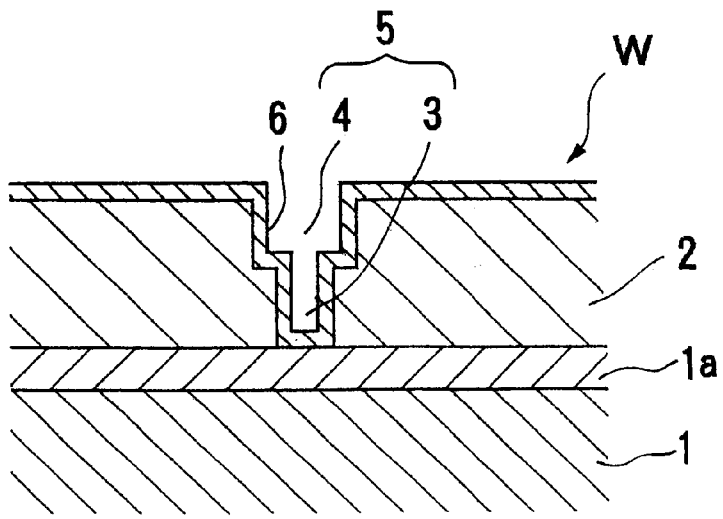
FIGS. 17A–17C are cross-sectional views showing steps of a fundamental process of manufacturing an interconnection for a semiconductor device by plating copper on a surface of a semiconductor substrate.
Figure 17B:
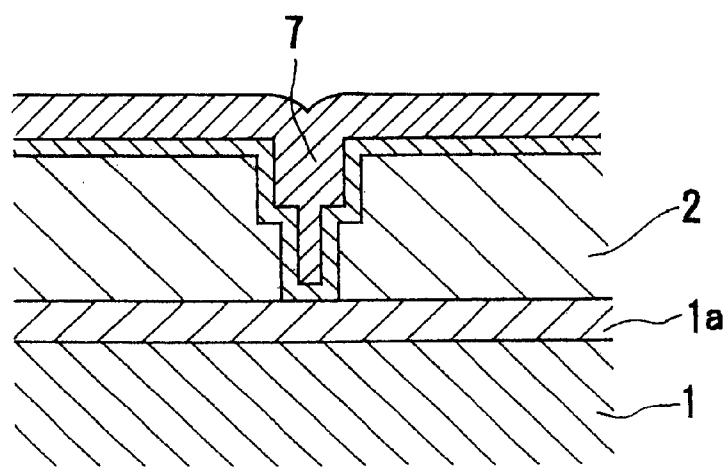
Figure 17C:
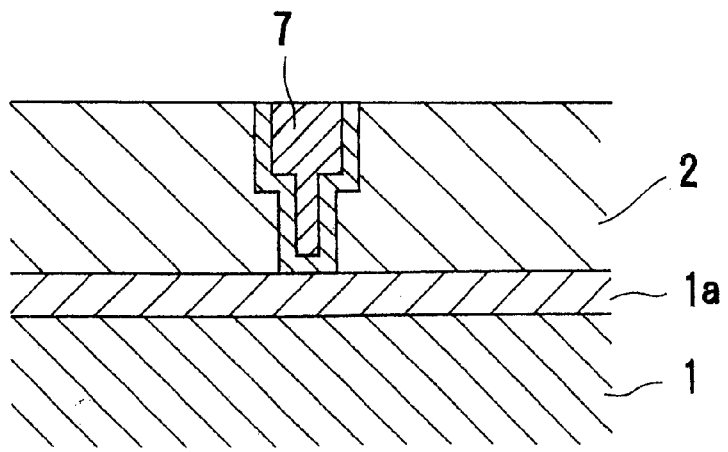
Figure 18A:
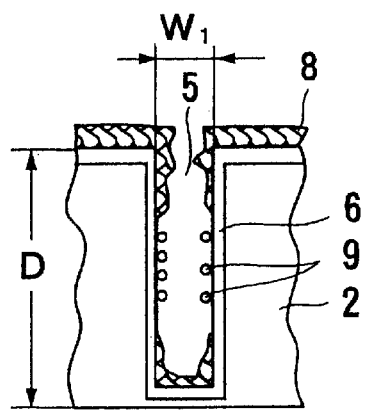
FIGS. 18A–18C are cross-sectional views illustrative of the generation of a void and a cavity in a conventional method of manufacturing a semiconductor device.
Figure 18B:
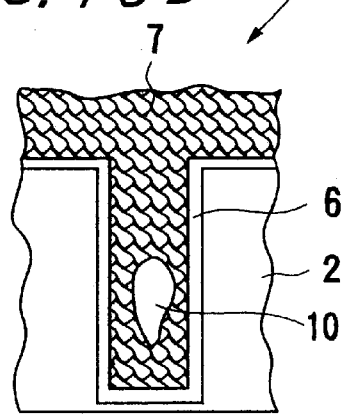
Figure 18C:
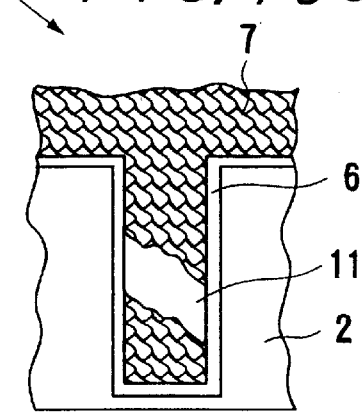
Figure 19A:
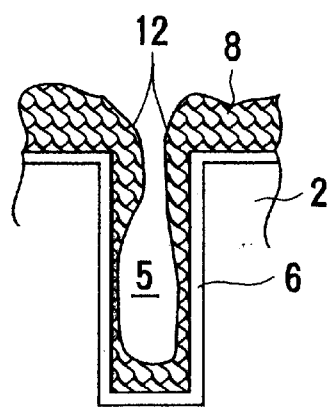
FIGS. 19A and 19B are cross-sectional views illustrative of the generation of a seam in a conventional method of manufacturing a semiconductor device.
Figure 19B:
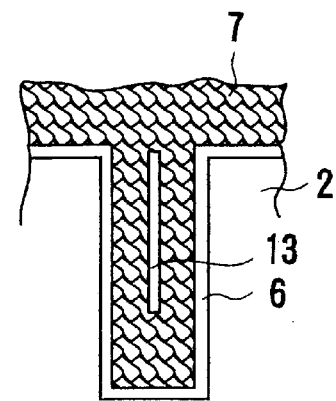

FIGS. 1A through 1C show a plating method according to an embodiment of the present invention, which is applied to the formation of a liner (undercoat film) by plating a metal on the surface of a substrate before an electrically conductive metal such as copper or the like is embedded by plating in a conductor-embedding fine recess that is defined in the surface of the substrate. The plating method is inserted between the step shown in FIG. 17A and the step shown in FIG. 17B of the fundamental process shown in FIG. 17.

First, as shown in FIG. 1A, a solution 20 is prepared in a container 21 by uniformly dissolving an organic metal compound which comprises a metal to be plated in a nonaqueous organic solvent, and adding a reducing agent.

The nonaqueous organic solvent may be a petroleum-based hydrocarbon such as toluene, xylene, kerosine, or the like, or a terpene such as turpentine oil, terpionel, or the like. The organic metal compound refers to a group of organic compounds containing various metals, which may comprise a fatty acid salt such as naphthenate, octylate, stearate, benzoate, paratoluate, n-decanoate, or the like, a metal alkoxide such as isopropoxoide, ethoxide, or the like, and an acetylacetone complex of each of the above metals. The reducing agent may comprise an alcohol such as methanol, ethanol, or the like, grape sugar, ascorbic acid, hydrazine, acetaldehyde, or the like.

As shown in FIG. 1B, a semiconductor substrate W with a conductor-embedding fine recess 5 (see FIG. 17A) defined in a surface thereof is held at its periphery by a substrate holder 24 while the surface with the recess 5 defined therein is facing downwardly, for example, and lowered to dip the surface with the recess 5 defined therein in the solution 20. After elapse of a predetermined period of time, the substrate W is lifted out of the solution 20.

In the solution 20, the organic metal compound is reduced by the reducing agent to precipitate the metal contained in the organic metal compound on the surface of the substrate W. Therefore, as shown in FIG. 1C, the surface of the substrate W which is dipped in the solution 20 is plated with the metal, thus forming a liner 26. At this time, the solution 20 enters the fine recess 5 in the surface of the substrate W easily and reliably, so that the liner 26 which is free of defects and sound is formed on the surface of the substrate W including the inner surfaces of the recess 5.

In this example, the organic metal compound is reduced by the reducing agent. However, if the organic metal compound can be reduced by being decomposed itself at a low temperature, then the organic metal compound may be reduced by a self-reduction decomposing reaction with heat. In this case, the solution 20 comprises an organic metal compound dissolved in a nonaqueous organic solvent having a boiling point higher than the self-decomposing reduction temperature of the organic metal compound, without the addition of a reducing agent. As indicated by the imaginary lines in FIG. 1B, the solution 20 is heated to a temperature higher than the self-decomposing reduction temperature of the organic metal compound, by a heater (heating unit) 28 disposed below the container 22, for example, thus reducing the organic metal compound to precipitate the metal contained in the organic metal compound on the surface of the substrate W thereby to form a liner 26 on the surface of the substrate W with the recess 5 defined therein by way of metal plating.

In order to form an interconnection using the liner 26 thus formed, the surface of the substrate W with the recess 5 defined therein is dipped in an electrolytic plating liquid, and an electric field is applied to perform electrolytic copper plating on the surface of the semiconductor substrate W. Since the surface of the substrate W including the inner surfaces of the recess 5 is uniformly covered with the liner 26, defects such as voids, seals, etc. are prevented from being generated in the copper 7 (see FIG. 17B) embedded in the fine recess 5 to form an interconnection.

Thereafter, the assembly is chemically and mechanically polished (CMP) to remove the copper 7 on the insulating layer 2 and the barrier layer 6 until the surface of the copper 7 filled in the recess 5 lies flush with the surface of the insulating film 2. In this manner, an embedded interconnection of the copper 7 is formed (see FIG. 17C).

In the above example, the substrate is subjected to electrolytic plating. If the substrate is to be processed by electroless plating, then a catalytic layer of a metal catalyst material is formed in place of the feed layer, and used as a liner.

Figure 2A:
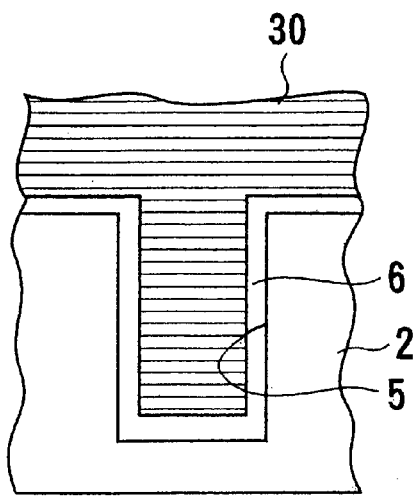
FIGS. 2A–2C are schematic views showing steps of a plating method (a method of forming an interconnection) according to another embodiment of the present invention.
Figure 2B:
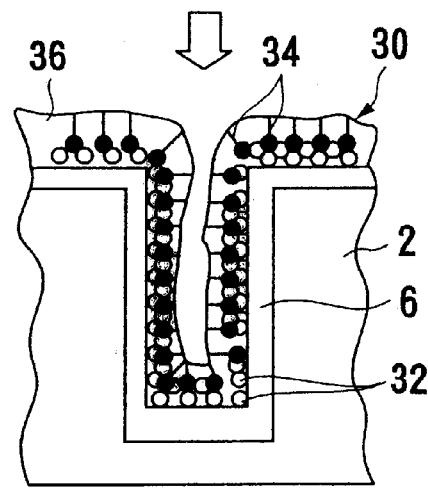
Figure 2C:
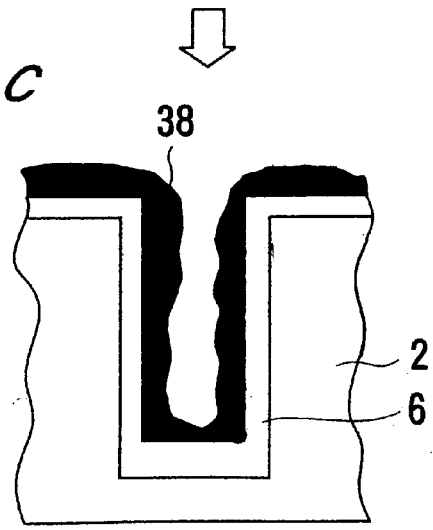

FIGS. 2A through 2C show a plating method according to another embodiment of the present invention for forming a liner on a surface of a substrate by way of metal plating and forming an interconnection using the liner thus formed.

As shown in FIG. 2A, a fine recess 5 for forming an interconnection is defined in an insulating film 2 of $SiO_2$ deposited on a semiconductor base material of a semiconductor substrate W by lithography and etching, and a barrier layer 6 of tantalum nitride (TaN) or the like is deposited on the surface of the insulating film 2. Then, a ultrafine particle dispersed liquid 30 is supplied to the surface of the barrier layer 6.

As shown in FIGS. 3A and 3B, the ultrafine particle dispersed liquid 30 comprises ultrafine silver particles 32 each made of a highly electrically conductive material such as silver alone and covered with alkyl chain shells 34, and diluted by an organic solvent 36 (see FIG. 2B) such as cyclohexane or the like to a predetermined concentration. The ultrafine silver particles 32 have an average diameter which usually ranges from 1 to 20 nm and preferably from 1 to 10 nm.

The ultrafine silver particles 32 covered with the alkyl chain shells 34 are produced by preparing a linear fatty acid silver salt (the carbon number of the alkyl chain =14, 18, 18ω)) by saponifying a myristic acid, a stearic acid, or an oleic acid, for example, with sodium hydroxide and thereafter reacting the saponified acid with silver nitrate, heating the linear fatty acid silver salt thus prepared in a nitrogen atmosphere at about 250° C. for 4 hours, and then refining the heated linear fatty acid silver salt.

When the ultrafine silver particles 32 made of such small diameters are dissolved in the organic solvent 36 such as cyclohexane or the like, they are dispersed highly well in the organic solvent 36 and uniformly mixed stably in the organic solvent 36 without agglomerating together. Specifically, the ultrafine silver particles 32 are held out of contact with each other and uniformly dispersed in the organic solvent 36. The ultrafine silver particles 32 are deformable to a large extent at the normal temperature and can be handed with ease in the atmosphere at the normal temperature and under the normal pressure. The ultrafine particle dispersed liquid 30 with the ultrafine silver particles 32 uniformly dispersed therein enters the fine recess 5 uniformly.

Then, as shown in FIG. 2B, the ultrafine particle dispersed liquid 30 is dried to increase its concentration. As the liquid evaporates, the ultrafine silver particles 32 covered with the alkyl chain shells 34 are uniformly attached to the overall surface of the barrier layer 6. Even after the ultrafine particle dispersed liquid 30 is dried up, the ultrafine silver particles 32 can be dissolved again into a suitable solvent. Therefore, the thickness of the attached film of the ultrafine silver particles 32 can easily be adjusted.

Then, the assembly is heated to about 200° C., for example, to bake the ultrafine particle dispersed liquid 30 that has been dried up. It is known that the alkyl chain shells 34 covering the ultrafine silver particles 32 are eliminated when heated to about 200° C. When the ultrafine particle dispersed liquid 30 is baked, therefore, the ultrafine silver particles 32 are melted together. As shown in FIG. 2C, the melted ultrafine silver particles 32 serve as a liner 38 comprising a pure thin silver film. The liner 38 lends itself to a plating process for uniformly covering the entire surface of the barrier layer 6 including the side walls of the fine recess 5.

The thickness of the liner 38 can be adjusted, 0.1 $\mu$m or less per drying cycle, for example, by adjusting the concentration of the ultrafine particle dispersed liquid 30. Since the thin liner 38 having a required and sufficient thickness can freely be formed to cover the inner surfaces of the fine recess 5, a liner indispensable for the electrolytic plating process can easily be formed without difficulties encountered by the conventional sputtering process to produce such a liner.

Then, the surface of the substrate W is dipped in an electrolytic plating liquid, and an electric field is applied to perform electrolytic copper plating on the surface of the semiconductor substrate W. Since the surface of the substrate W including the inner surfaces of the recess 5 is uniformly covered with the liner 38, defects such as voids, seals, etc. are prevented from being generated in the copper 7 (see FIG. 17B) embedded in the fine recess 5 to form an interconnection.

Thereafter, the assembly is chemically and mechanically polished (CMP) to remove the copper 7 on the insulating layer 2 and the barrier layer 6 until the surface of the copper 7 filled in the recess 5 lies substantially flush with the surface of the insulating film 2. In this manner, an embedded interconnection of the copper 7 is formed (see FIG. 17C).

An apparatus for forming an interconnection according to the present invention, which is used to carry out the above method of forming an interconnection, will be described below with reference to FIGS. 4 through 16.

Figure 4:
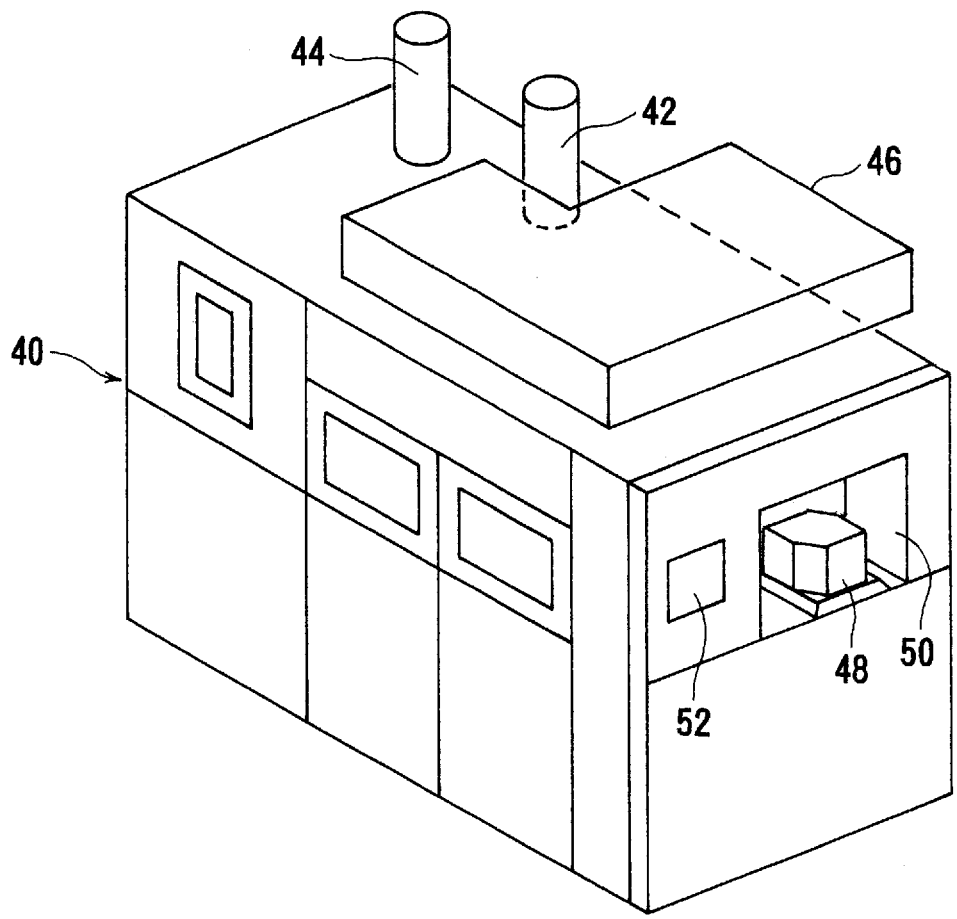
FIG. 4 is a prospective view showing an appearance of an apparatus for forming an interconnection according to the present invention.

FIG. 4 shows a rectangular indoor facility 40 which incorporates an apparatus for forming an interconnection therein. The indoor facility 40 has on its ceiling a discharge duct 42 for discharging exhaust gases in a dispersed liquid supply section 68 and a heat-treating section 70, described below, a discharge duct 44 for discharging exhaust gases in an electrolytic plating section 74, and an air-conditioning unit 46 for air-conditioning a polishing (CMP) section 78, etc. The indoor facility 40 also has an inlet/outlet port 50 defined in a side wall thereof for introducing and removing a cassette 48 with substrates W housed therein and a control panel 52 mounted on the side wall.

Figure 5:
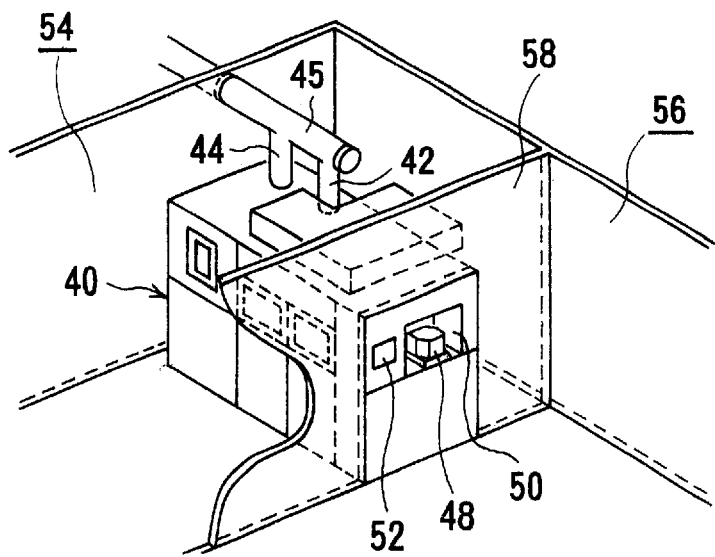
FIG. 5 is a partly broken away perspective view showing, by way of example, the apparatus for forming an interconnection according to the present invention which is disposed in a clean room.

As shown in FIG. 5, for example, the indoor facility 40 is disposed in a utility zone 54 in a clean room. The indoor facility 40 has an end portion in an opening defined in a partition wall 58 which divides the utility zone 54 and a clean zone 56 from each other, with the inlet/outlet port 50 and the control panel 52 being exposed in the clean zone 56. The discharge ducts 42, 44 are connected to a common discharge duct 45 that extends out of the utility zone 54.

Figure 6:
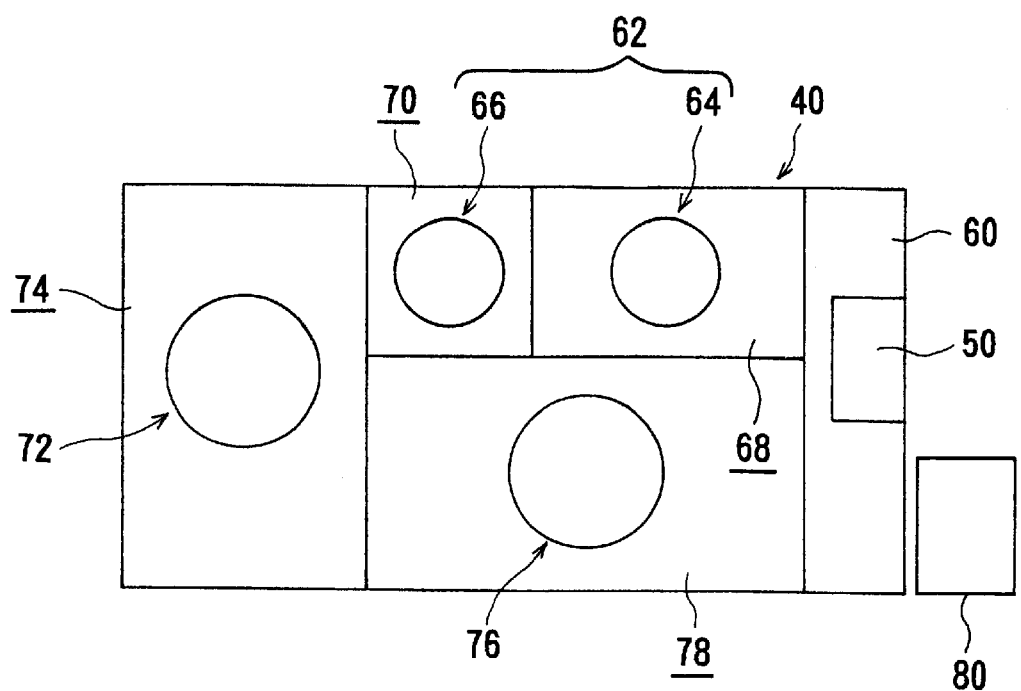
FIG. 6 is a plan view of the apparatus for forming an interconnection according to the present invention.

As shown in FIG. 6, the indoor facility 40 has its interior divided into a loading/unloading section 60 having the inlet/outlet port 50, a dispersed liquid section 68 and a heat-treating section 70 housing a dispersed liquid supply device 64 and a heat-treating device 66 comprising a liner forming device 62 therein, respectively, an electrolytic plating section 74 housing an electrolytic plating device 72 therein, and a polishing section 78 housing a polishing device 76 therein. These devices 64, 66, 72, 76 are arranged in a sequence along the direction in which the substrate flows, so that a series of interconnection forming steps can successively be performed on the substrate. The dispersed liquid supply section 64 and the heat-treating device 66 are made of an explosion-proof structure in view of the explosiveness of an organic solvent.

The devices 64, 66, 72, 76 are operated and managed by respective independent control computers. Operating and managing information of these devices is exchanged between these computers by a process management computer 80, which performs a process feedback management process thereby to optimize the process as a whole.

The operating and managing information includes quality managing information produced by an analyzing device in si-tu. For example, if the thickness of a film plated in the electrolytic plating step tends to become insufficient, then the thickness insufficiency is predicted and the processing time of the electrolytic plating step is extended. Information of the extended processing time is fed back to the liner forming step to hold an intermediate material in a primary storage location, and the processing of a next intermediate material is extended without operator's instruction for thereby increasing the product quality for an increased yield.

FIGS. 7 through 11 show the dispersed liquid supply device 64 and the heat-treating device 66 comprising the liner forming device 62, and a supplementary drying device 82 which is provided if necessary.

Figure 7:
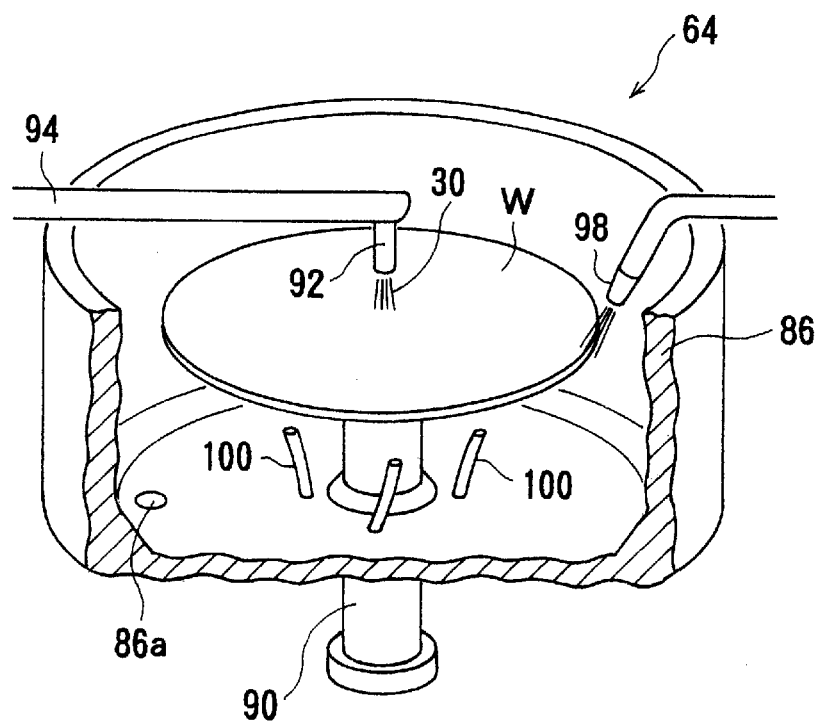
FIG. 7 is a perspective view, partly broken away, of a dispersed liquid supply device of a liner forming device of the apparatus for forming an interconnection according to the present invention.
Figure 8:
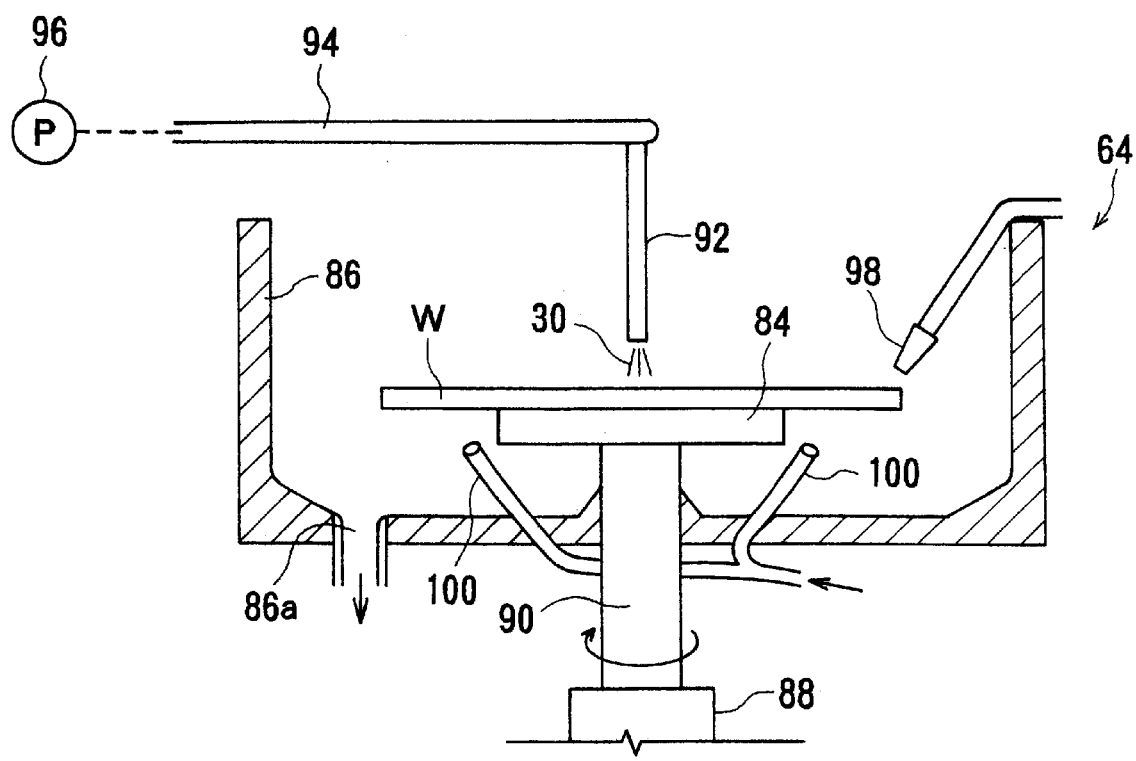
FIG. 8 is a vertical cross-sectional view of the dispersed liquid supply device.

The dispersed liquid supply device 64, which supplies the ultrafine particle dispersed liquid 30 (see FIG. 2A) to the surface of the substrate W, as shown in FIGS. 7 and 8, comprises a substrate holder 84 for holding and rotating the substrate W with its interconnecting forming surface (face side) oriented upwardly, and a bottomed cup-shaped scattering prevention plate 86 surrounding the substrate W that is held by the substrate holder 84. The substrate holder 84 has a vacuum chuck on its upper surface for attracting and holding the substrate W, and is connected to the upper end of a rotatable shaft 90 that extends from a servomotor 88 for rotation upon energization of the servomotor 88. The scattering prevention plate 86 is made of a material resistant to organic solvents, e.g., stainless steel.

A downwardly directed dispersed liquid supply nozzle 92 for dropping the ultrafine particle dispersed liquid 30 is positioned upwardly of either the center of the surface of the substrate W that is held by the substrate holder 84 or a spot slightly off the center of the surface of the substrate W. The dispersed liquid supply nozzle 92 is connected to the free end of an arm 94. The arm 94 accommodates therein a pipe for supplying a metered amount of ultrafine particle dispersed liquid. The pipe extends from a metered amount supply device 96 such as a syringe pump or the like and is communicated to the dispersed liquid supply nozzle 92.

A bevel washing nozzle 98 which is inclined downwardly inwardly is positioned above the circumferential area of the substrate W held by the substrate holder 84, for supplying a washing liquid to the bevel of the substrate W. A plurality of reverse side washing nozzles 100 which are inclined upwardly outwardly are positioned below the substrate W held by the substrate holder 84, for supplying a gas or washing liquid to the reverse side of the substrate W. The scattering prevention plate 86 has a drain hole 86a defined in its bottom.

Therefore, the substrate W is held by the substrate holder 84, and the servomotor 88 is energized to rotate the substrate W at a speed ranging from 300 to 500 rpm, for example, more preferably from 400 to 500 rpm. While the substrate W is being thus rotated, the dispersed liquid supply nozzle 92 drops a metered amount of ultrafine particle dispersed liquid 30 onto the central area of the surface of the substrate W. When the surface of the substrate W is covered with the ultrafine particle dispersed liquid 30, the dropping of the ultrafine particle dispersed liquid 30 is stopped, so that the surface of the substrate W is uniformly coated with the ultrafine particle dispersed liquid 30. At the same time, the bevel washing nozzle 98 supplies a hydrophilic organic solvent such as methanol, acetone, or the like, or a washing liquid such as ethanol, isopropyl alcohol, or the like, to the bevel of the substrate W to prevent the ultrafine particle dispersed liquid 30 from dropping from the edge of the substrate W or flowing across the edge of the substrate W to the reverse side of the substrate W. The reverse side washing nozzles 100 also supplies a gas such as an $N_2$ gas, air, or the like, or a washing liquid which is the same as the washing liquid supplied to the bevel of the substrate W, to the reverse side of the substrate W to prevent the contamination of the reverse side of the substrate W by using the gas flow or the washing liquid.

With the dropping of the ultrafine particle dispersed liquid 30 being stopped, the servomotor 88 rotates the substrate W to dry the substrate W in a spin drying process (air drying process) to evaporate the solvent in the ultrafine particle dispersed liquid 30 coated on the substrate W.

The process of applying the ultrafine particle dispersed liquid 30 to the interconnection forming surface of the substrate W and spin-drying the substrate W is repeated a plurality of times as required. This process is put to an end when the layer of dried the ultrafine-particle dispersed liquid 30 (see FIG. 2B) remaining on the substrate W reaches a certain thickness.

Finally, the substrate may be rotated at a higher speed to quicken the drying of the solvent. An excessive amount of ultrafine particle dispersed liquid 30 and the washing liquid that has been used to wash the bevel and reverse side of the substrate are discharged out of the drain hole 86a.

Figure 9:
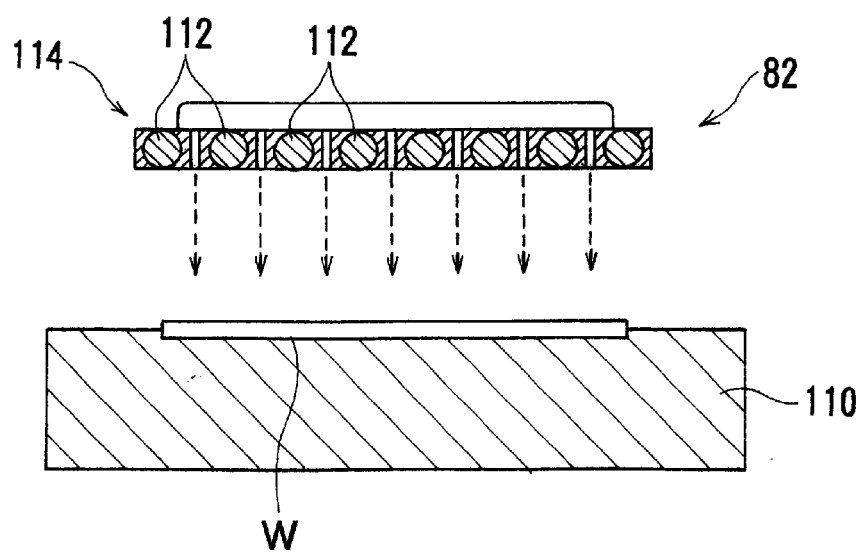
FIG. 9 is a cross-sectional view of a supplementary drying device of the liner forming device of the apparatus for forming an interconnection according to the present invention.

As shown in FIG. 9, the supplementary drying device 82 has a substrate holding base 110 for holding the substrate W with its face side oriented upwardly and a heating device 114 disposed above the substrate holding base 110, the heating device 114 comprising lamp heaters 112, for example.

The supplementary drying device 82 serves to dry up the solvent that has not been evaporated by the spin drying process carried out by the dispersed liquid supply device 64. The supplementary drying device 82 may not necessarily be required if the solvent is sufficiently dried up by the spin-drying process carried out by the dispersed liquid supply device 64 such as when the solvent is coated as a very thin film.

Specifically, if the layer of the ultrafine particle dispersed liquid 30 (see FIG. 2B) deposited on the surface of the substrate W is heated while the organic solvent remains in the layer, voids may possibly be produced at the bottom of the trench. Such voids are prevented from occurring by completely drying up the solvent with the supplementary drying device 82. The temperature to be achieved by the supplementary drying device 82 is preferably a temperature at which the ultrafine particles are not decomposed, e.g., about 100° C., for thereby preventing a contamination of the supplementary drying device 82 which would otherwise be caused by the decomposition of the ultrafine particles.

Figure 10:
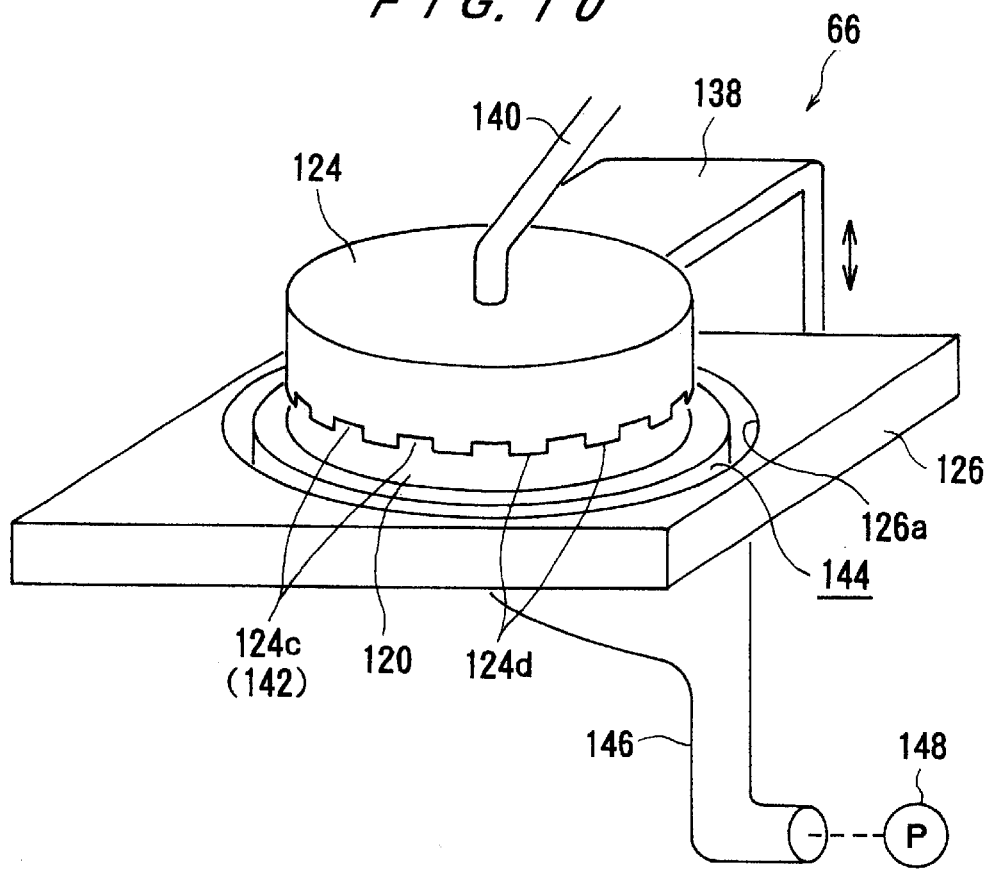
FIG. 10 is a schematic view of a heat-treating device of the liner forming device of the apparatus for forming an interconnection according to the present invention.
Figure 11:
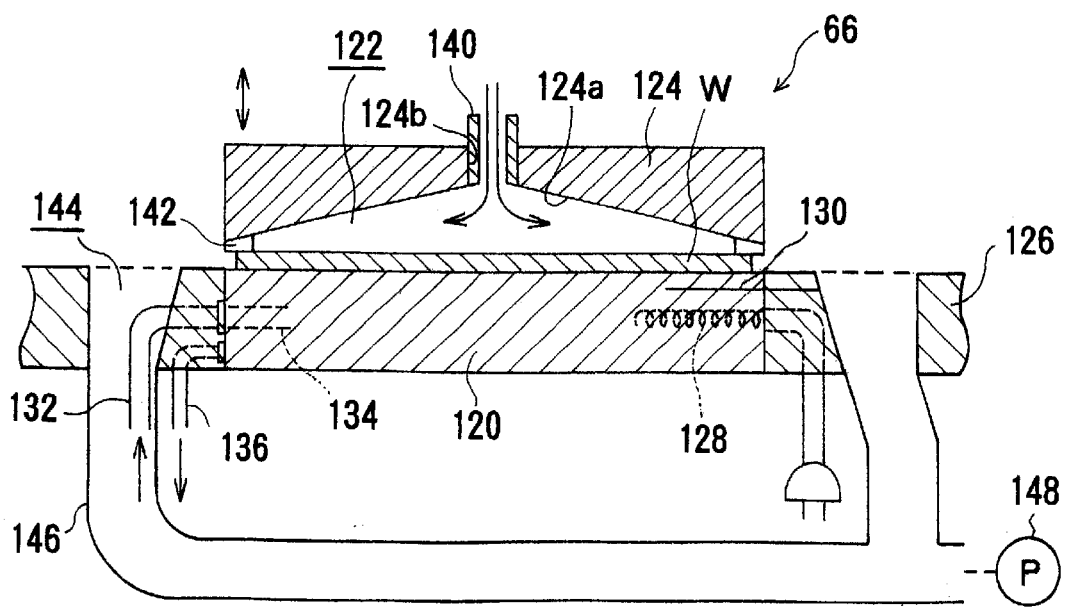
FIG. 11 is a vertical sectional front elevational view of the heat-treating device.

The heat-treating device 66 serves to heat the layer of the dried ultrafine particle dispersed liquid 30 (see FIG. 2B) to melt and bond the metal together. As shown in FIGS. 10 and 11, the heat-treating device 66 has a heating plate 120 for holding and heating the substrate W with its face side directed upwardly, a housing 124 which surrounds a space above the substrate W that is held by the heating plate 120 to define a gas chamber 122 between the housing 124 and the heating plate 120, and a frame 126 which surrounds the heating plate 120.

The heating plate 120 is made of aluminum or copper which has a high heat conductivity and can uniformly be heated at a high speed, and is in the form of a disk. The heating plate 120 houses therein a heater 128 and a temperature sensor 130 for detecting the temperature of the heating plate 120. The heating plate 120 also has a coolant flow passage 134 communicating with a coolant inlet passage 132 for introducing a coolant such as a cooling gas, air, or the like. The coolant flow passage 134 communicates with a coolant outlet passage 136.

The housing 124 is made of ceramics, for example, and is fixed to the free end of a vertically movable arm 138. The housing 124 has a conical recess 124a defined in the reverse side thereof which provides the gas chamber 122 between itself and the substrate W placed on and held by the heating plate 120 when the housing 124 is displaced downwardly. Furthermore, the housing 124 has a gas supply port 124b defined centrally therein which is connected to a gas supply pipe 140. The housing 124 also has an alternately arranged succession of slits 124c and pressers 124d on its lower peripheral edge. When the housing 124 is displaced downwardly, the pressers 124d are brought into abutment against the peripheral edge of the substrate W that is placed on and held by the heating plate 120, gripping and holing the peripheral edge of the substrate W between the heating plate 120 and the pressers 124d, and the slits 124c provide gas discharge ports 142.

The frame 126 has a through hole 126a defined therein which provides a gas inlet port 144 with an inner surface thereof. A discharge duct 146 communicating with the gas inlet port 144 is fixed to the reverse side of the frame 126, and is connected to a discharge blower 148.

Therefore, the substrate W is placed on and held by the upper surface of the heating plate 120. The substrate W is heated to 300° C. in 5 minutes, for example, held at 300° C. for 5 minutes, and then cooled to the room temperature in 10 minutes, thus melting and bonding the ultrafine composite metal particles together. At this time, an inactive gas of $N_2$ or the like containing a small amount of oxygen or ozone is introduced from the gas supply pipe 140 into the gas chamber 122, and thereafter an inactive gas of $N_2$ or the like only is introduced from the gas supply pipe 140 into the gas chamber 122. The oxygen or ozone acts as a catalyst to separate the organic substance and the metal from each other, thus promoting the decomposition of the ultrafine particles. An oil mist produced when the ultrafine particles are decomposed is removed from the substrate surface by the $N_2$ gas, for example. Therefore, the oil mist is prevented from fuming and becoming stagnant on the substrate surface to contaminate the substrate.

The oxygen or ozone may be added in a small quantity as it would undesirably oxidize the ultrafine particles if added in an excessive amount.

When a liner is to be formed using ultrafine particles of silver, it is preferable that the ultrafine particle layer be heated (baked) while a nitrogen gas containing a small amount of oxygen or ozone is flowing, and thereafter a nitrogen gas containing hydrogen is supplied to prevent the silver from being oxidized and reduce the silver to form interconnections of pure silver, after which the gas is changed to a nitrogen gas. In this manner, the liner can be formed efficiently.

FIG. 12 shows the electrolytic plating device 72 of the so-called face-down type. The electrolytic plating device 72 comprises an upwardly open cylindrical plating tank 152 which holds a plating liquid 150 therein, and a substrate holder 154 for holding the substrate W removably with its face side oriented downwardly and placing the substrate W in a position to close the opening in the upper end of the plating tank 152. The plating tank 152 houses therein a flat anode plate 156 lying horizontally and serving as an anode electrode when immersed in the plating liquid 150, with the substrate W serving as a cathode electrode. The anode electrode 156 is made of a porous material or a material having a mesh pattern.

A plating liquid ejector pipe 158 for producing an upward plating liquid flow is connected to the center of the bottom of the plating tank 152. A plating liquid reservoir 160 is disposed around an upper portion of the plating tank 152. The plating liquid ejector pipe 158 is connected to a plating liquid supply pipe 168 that extends from a plating liquid storage tank 162 and has a pump 164 and a filter 166. The plating liquid storage tank 162 is connected to a plating liquid return pipe 169 that extends from the plating liquid reservoir 160.

The substrate W is held, with its face side down, above the plating tank 152 by the substrate holder 154. While a given voltage is being applied between an anode plate 156 (anode electrode) and the substrate W (cathode electrode), the plating liquid 150 in the plating liquid storage tank 162 is ejected upwardly from the bottom of the plating tank 152 by the pump 164 and applied perpendicularly to the lower surface (to be plated) of the substrate W, forming a plated film on the lower surface of the substrate W with a plating current flowing between the anode plate 156 and the substrate W. At this time, the plating liquid 150 that has overflowed the plating tank 152 is retrieved by the plating liquid reservoir 160, and flows back into the plating liquid storage tank 162.

Figure 13:
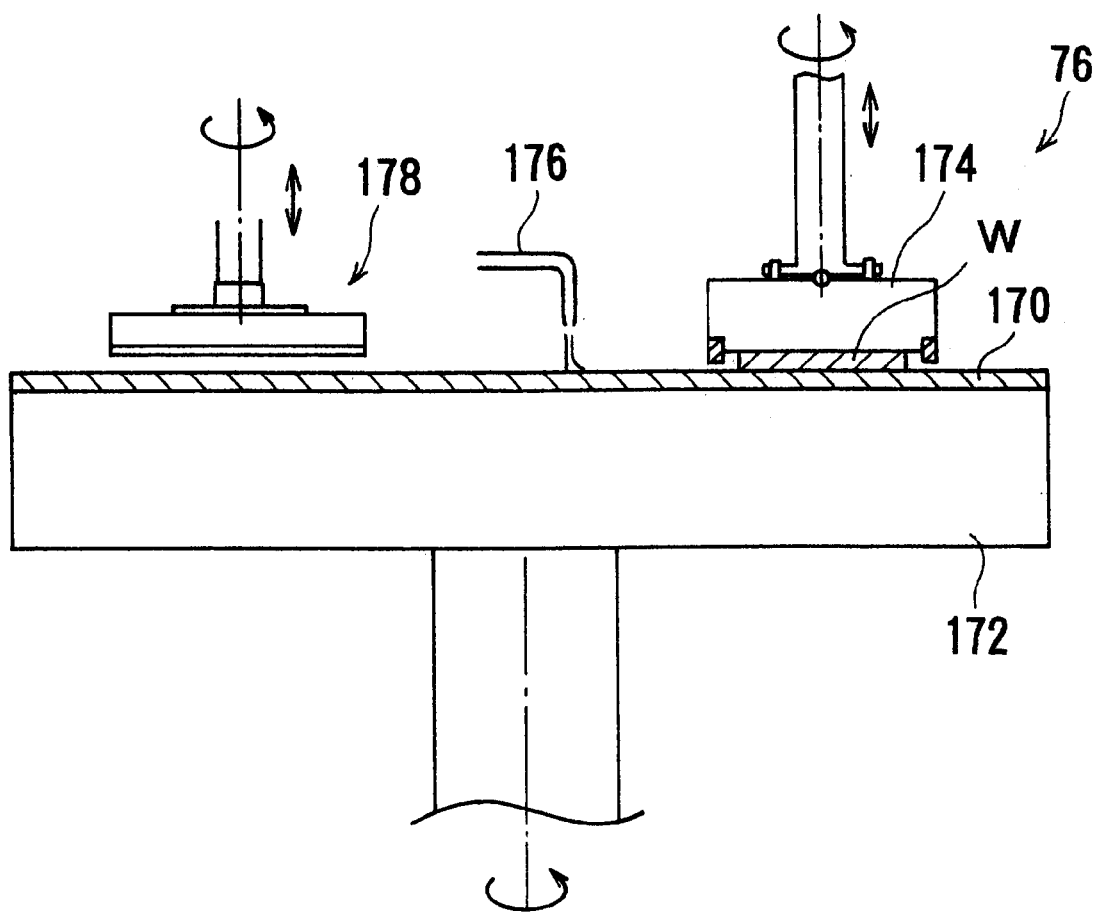
FIG. 13 is a schematic view of a polishing device of the apparatus for forming an interconnection according to the present invention.

FIG. 13 shows the polishing device 76 which carries out chemical mechanical polishing (CMP) to the surface of the substrate W to remove excessively attached metal therefrom. The polishing device 76 comprises a polishing table 172 with a polishing cloth (polishing pad) 170 applied to its upper surface to provide a polishing surface, and a top ring 174 for holding the substrate W with its surface to be polished being directed toward the polishing table 172. The polishing table 172 and the top ring 174 are rotated about their respective own axes. While the polishing cloth 170 is being supplied with an abrasive liquid from an abrasive liquid nozzle 176 disposed above the polishing table 172, the top ring 174 presses the substrate W under a constant pressure against the polishing cloth 170 on the polishing table 172, thereby polishing the surface of the substrate W. The abrasive liquid supplied from the abrasive liquid nozzle 176 comprises, for example, an alkaline solution containing a suspended abrasive grain which comprises fine particles of silica or the like. Therefore, the substrate W is polished to a flat and mirror finish by a chemical and mechanical polishing process based on a combination of a chemical polishing action of the alkali and a mechanical polishing action of the abrasive grain.

When the polishing device 76 continuously performs the polishing process, the polishing power of the polishing surface of the polishing cloth 170 is lowered. To recover the polishing power, a dresser 178 is provided. The polishing cloth 170 is dressed by the dresser 178 such as when the substrate W is replaced with another substrate to be polished. In the dressing process, a dressing surface (dressing member) of the dresser 178 is pressed against the polishing cloth 170 on the polishing table 172, and the dresser 178 and the polishing table 172 are rotated about their respective own axes to remove the abrasive liquid and abatement attached to the polishing surface, and also to planarize and dress the polishing surface for thereby regenerating the polishing surface.

The apparatus for forming an interconnection, thus constructed, operates as follows: The cassette 48 with substrates W housed therein is placed in the inlet/outlet port 50, and one substrate W is taken out of the cassette 48 and delivered to the dispersed liquid supply device 64 of the dispersed liquid supply section 68. In the dispersed liquid supply device 64, the surface of the substrate W is supplied with the ultrafine particle dispersed liquid 30 and then spin-dried, and this process is repeated a plurality of times as required until the layer of the ultrafine particle dispersed liquid 30 (see FIG. 2B) reaches a predetermined thickness. Then, the substrate W is delivered to the supplementary drying device 82. In the supplementary drying device 82, the solvent in the ultrafine particle dispersed liquid 30 is evaporated. Then, the substrate W is delivered to the heat-treating device 66 of the heat-treating section 70. In the heat-treating device 66, the ultrafine particle dispersed liquid 30 from which the solvent has been evaporated is heated to melt and bond the metal together, thus forming a liner.

The substrate W with the liner formed thereon is then delivered to the electrolytic plating device 72 of the electrolytic plating section 74. In the electrolytic plating device 72, the surface of the substrate W is electrolytically plated. The plated substrate is delivered to the polishing device 76 of the polishing section 72. In the polishing device 76, the surface of the substrate W is chemically and mechanically polished to remove excessive metal therefrom. The substrate W is then returned to the cassette 48. The apparatus for forming an interconnection is capable of successively performing the above steps in the sequence.

Figure 14:
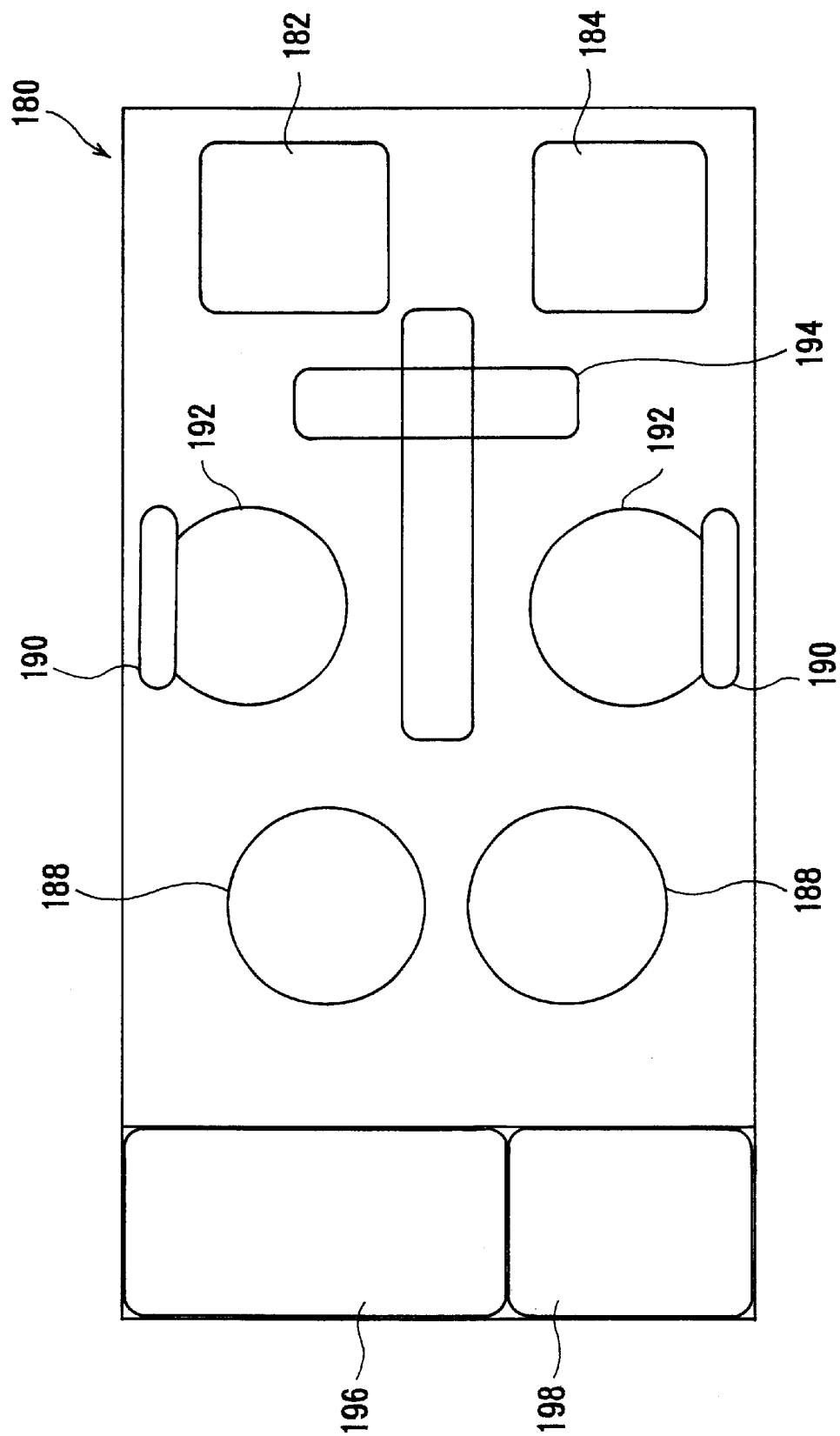
FIG. 14 is a plan view of another plating device (liner forming device) according to the present invention.
Figure 15:
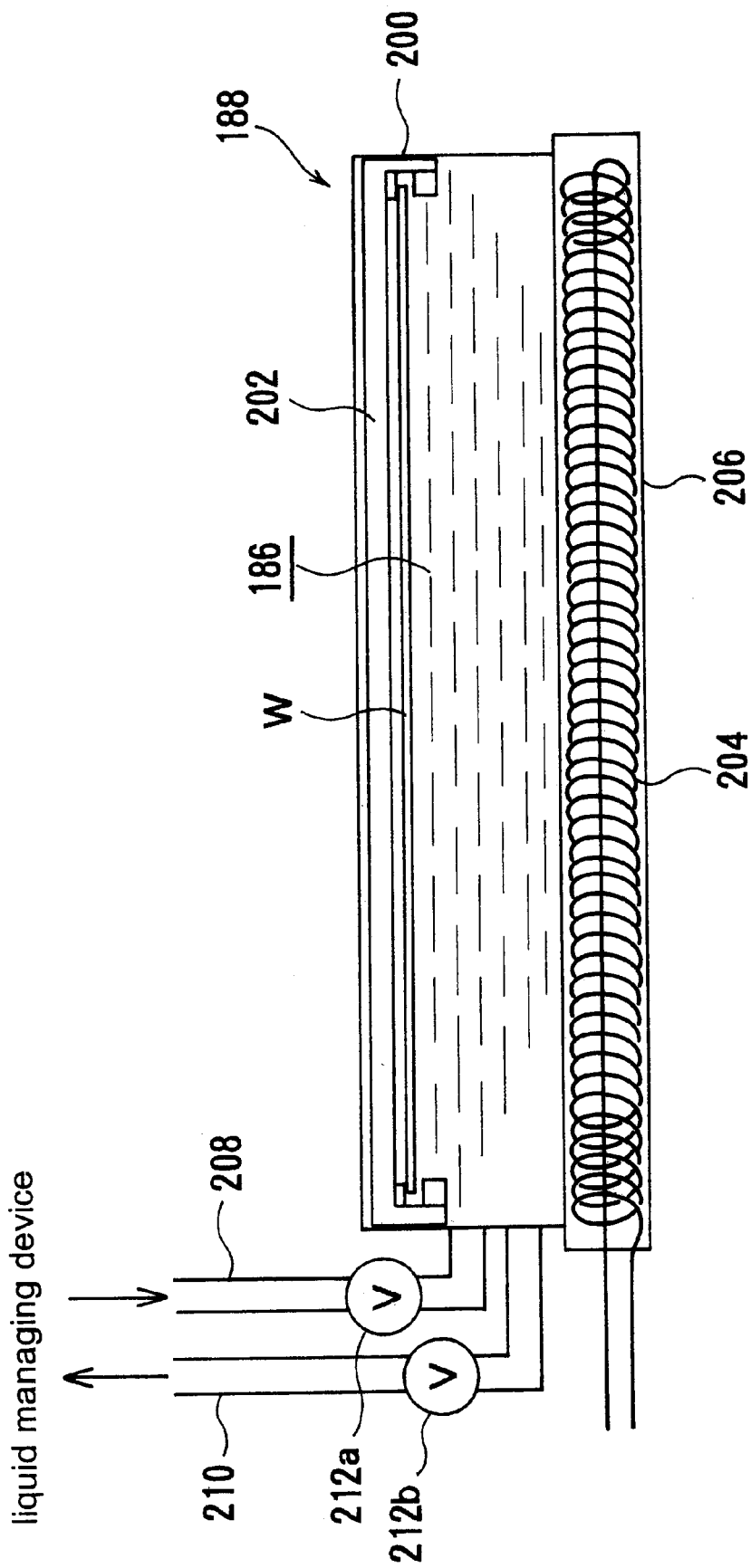
FIG. 15 is a cross-sectional view of a plating bath of the plating device shown in FIG. 14.

FIGS. 14 and 15 show a plating device 180 as a liner forming device for forming a liner on the surface of a substrate according to the plating method shown in FIG. 1.

The plating device 180 (the liner forming device) 180 comprises, as shown in FIG. 14, a substrate loading unit 182 and a substrate unloading unit 184 each for holding a substrate W, plating baths 188 each holding a plating liquid 186 (see FIG. 15), washing tanks 192 having respective washing rollers 190, and a transfer robot 194 as a transfer device for transferring substrates W between the above components. The plating device 180 also has a plating liquid managing device 196 for managing the plating liquid 186 and a control device 198.

As shown in FIG. 15, each of the plating baths 188 comprises a dipping tank 200 holding the plating liquid 186 therein and a substrate holder 202 for holding a substrate W with its reverse side sealed in a water-tight fashion and its face side exposed. Beneath the dipping tank 202, there is disposed a heating block 206 as a heating device having a heater 204 therein. To the dipping tank 200, there are connected a plating inlet pipe 208 and a plating outlet pipe 210 which extend from the plating liquid managing device 196 and which have valves 212a, 212b, respectively.

A solution that is prepared by uniformly dissolving an organic metal compound which comprises a metal to be plated in a nonaqueous organic solvent and adding a reducing agent, or if an organic metal compound is reduced by being decomposed itself at a low temperature, then a solution that is prepared by dissolving an organic metal compound dissolved in a nonaqueous organic solvent having a boiling point higher than the self-decomposing reduction temperature of the organic metal compound, is used as the plating liquid 186. The plating liquid 186 is introduced into the dipping tank 200, and the surface of the substrate W held by the substrate holder 202 with its reverse side sealed in a water-tight fashion and its face side exposed is dipped in the plating liquid 186. If necessary, the plating liquid 186 is heated by the heating block 206 to reduce the organic metal compound in the plating liquid 186, precipitating the metal contained in the organic metal compound on the surface of the substrate W. Therefore, the surface of the substrate W is plated, thus forming a liner 26 (see FIG. 1C). The plated substrate W is then introduced into one of the washing tanks 192, and the surface of the substrate is washed by the corresponding washing roller 190, after which the substrate is delivered to a next process.

The plating device 180 may be used singly for forming a liner, or may be used in place of the liner forming device 62 shown in FIG. 6. Specifically, if the plating device 180 is used in place of the liner forming device 62 shown in FIG. 6, a substrate removed from the cassette 48 is loaded into the substrate loading unit 182 of the plating device 180, and, after the substrate is plated, it is unloaded from the substrate unloading unit 184 to the electrolytic plating device 72 for a next process.

Figure 16:
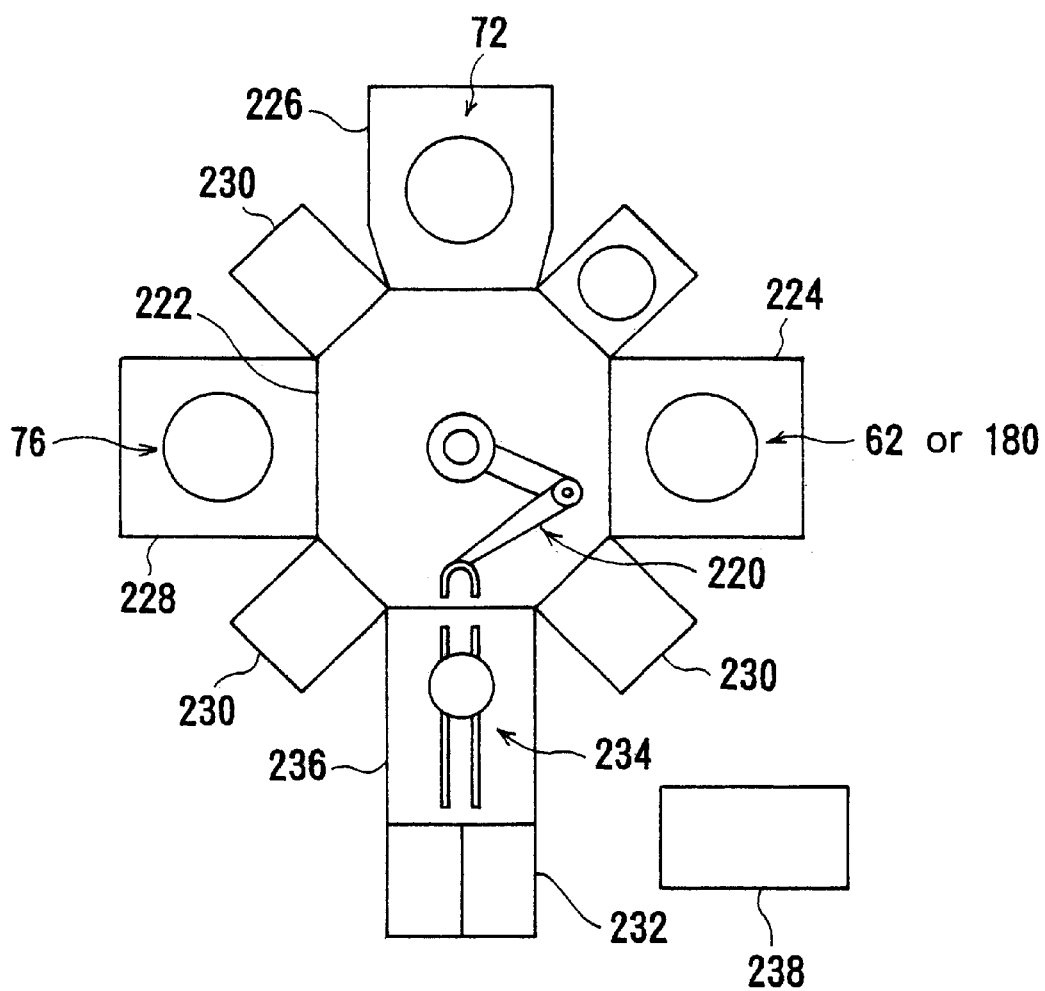
FIG. 16 is a plan view showing the layout of another apparatus for forming an interconnection according to the present invention.

FIG. 16 shows another example of an apparatus for forming an interconnection. The apparatus for forming an interconnection comprises a central transfer chamber 222 having a transfer robot 220 disposed therein, a liner forming chamber 224 housing the liner forming device 62 or 180 therein, an electrolytic plating chamber 226 housing the electrolytic plating device 72 therein, a polishing chamber 228 housing the polishing device 76 therein, and a plurality of stockyards (temporary placing chambers) 230 disposed in given positions between these chambers. The liner forming chamber 224, the electrolytic plating chamber 226, the polishing chamber 228, and the stockyards 280 are disposed radially around the central transfer chamber 222. The apparatus also has a second transfer chamber 236 having a mobile robot 234 disposed therein, the second transfer chamber 236 being positioned between a loading/unloading chamber 232 and the central transfer chamber 222. The apparatus for forming an interconnection also has a process managing computer 238 for exchanging operating information between computers thereby to optimize the process as a whole.

With the above apparatus for forming an interconnection, the liner forming chamber 224 housing the liner forming device 62 or 180 therein, the electrolytic plating chamber 226 housing the electrolytic plating device 72 therein, the polishing chamber 228 housing the polishing device 76 therein, and the other chambers can be constructed as units. Furthermore, various processes including a liner forming process, an electrolytic plating process, etc. can be individually performed and can be combined to carry out a process of forming an interconnection.

EXAMPLE 1

Silver stearate was placed into an eggplant-shaped flask having a volume of 1 L, and heated at 250° C. for 1 hour in a nitrogen atmosphere. As the compound was heated, its color changed from light yellow to light brown to purple. After the reaction, acetone was added to the compound, and the mixture was then refined by way of precipitation. Thereafter, the mixture was dispersed in toluene, and the mixture was refined by filtering and dried with air, thus obtaining ultrafine composite particles of silver.

The powder of ultrafine composite particles was then dispersed in toluene and xylene. No precipitation was recognized in either of the solutions, which appeared to be transparent. In other words, the powder was dissolvable.

The dispersion was used as an ultrafine particle dispersed liquid, and coated on a semiconductor substrate having conductor-embedding fine recesses at a ratio of 0.05 g per 1 cm. After the semiconductor substrate was dried, it was heated at about 250° C. in a nitrogen atmosphere. The ultrafine composite particles were easily baked, forming a silver liner.

The semiconductor substrate was then plated with copper according to a normal copper plating process using an independent plating device, with the silver liner serving as an electrode. Thereafter, the semiconductor substrate was chemically and mechanically polished by an independent device. These processes were managed by respective computers, and optimized by an exchange of information between the processes and feedback management.

EXAMPLE 2

A gold-imidazole complex was dissolved in toluene, and ethyl alcohol which corresponds to 5 wt % of toluene was added. The mixture was applied to a glass epoxy substrate, and left to stand for 2 hours. As a result, a liner of gold was formed on the surface of the substrate.

EXAMPLE 3

10 g of copper naphthene was dissolved in 300 ml of a petroleum-based high boiling solvent having a distilling point of 250° C., and 1 g of ascorbic acid was added. The mixture was applied to a glass substrate, and heated to 250° C. As a result, a liner of copper was formed on the surface of the glass substrate.

EXAMPLE 4

A semiconductor substrate with a conductor-embedding fine recess was dipped in a solution prepared by dissolving 10 g of silver abietate in 300 ml of isomer-mixed terpionel. After the solution was heated to 100° C., a reducing agent of lauryl alcohol was added. A liner of silver was formed on the semiconductor substrate 10 minutes later.

Using an apparatus with the various devices combined together, the semiconductor substrate was placed with copper with the liner of silver serving as an electrode. Thereafter, the semiconductor substrate was chemically and mechanically polished. These processes were managed by respective computers, and optimized by an exchange of information between the processes and feedback management.

According to the present invention, as described above, a substrate can be plated without the use of an aqueous solution, i.e., without being affected by an aqueous solution. Since no vacuum equipment needs to be used, the methods and apparatus according to the present invention can reduce cost, are suitable for small quantity, and can shorten the period of time required to deliver products. Since a defect-free sound liner is formed on the surface of a substrate which has a conductor-embedding fine recess by metal plating, it is possible to produce an embedded interconnection made of a sound electrically conductive body free of internal defects such as voids, seams, etc.

INDUSTRIAL APPLICABILITY

The present invention is concerned with a nonaqueous plating method for use in forming a liner before an electrically conductive metal such as copper or the like is embedded by plating in a conductor-embedding fine recess that is defined in a surface of a semiconductor substrate, an interconnection forming method for use in forming an interconnection using such a liner, and apparatus for carrying out such methods. By using the interconnection forming method for the fabrication of highly integrated semiconductor devices, the present invention contributes to the progress of a fabrication process for semiconductor devices.

What is claimed is:

1. A plating apparatus comprising:
   a container adapted for holding a solution prepared by uniformly dissolving an organic metal compound having a metal to be plated in a nonaqueous organic solvent and adding a reducing agent; and
   a substrate holder adapted for holding a substrate and dipping a surface, to be plated, of said substrate in the solution of said reducing agent held by said container.

2. A plating apparatus comprising:
   a container adapted for holding a solution prepared by dissolving an organic metal compound having a metal to be plated in a nonaqueous organic solvent having a boiling point higher than the self-decomposing reduction temperature of the organic metal compound;
   a heating device adapted for heating said solution to a temperature equal to or higher than the self-decomposing reduction temperature of the organic metal compound; and
   a substrate holder adapted for holding a substrate and including a dipping device adapted to dip a surface, to be plated, of said substrate in the solution held by said container.

3. An apparatus for forming an interconnection, comprising:
   a liner forming device adapted for forming a liner on a surface of a substrate having a fine recess formed therein by reducing an organic metal compound in a nonaqueous solvent; and
   an electrolytic plating device adapted for electrolytically plating the surface of said substrate using said liner.

4. An apparatus for forming an interconnection, comprising:
   a liner forming device adapted for forming a liner on a surface of a substrate having a fine recess formed therein including a supplying device adapted to supply an ultrafine particle dispersed liquid comprising ultrafine metal particles dispersed in a solvent to the surface of said substrate, and a baking device adapted to bake the ultrafine particle dispersed liquid; and
   an electrolytic plating device for electrolytically plating the surface of said substrate using said liner.

5. An apparatus according to claim 4, wherein said liner forming device has a dispersed liquid supply device for supplying said ultrafine particle dispersed liquid to the surface of said substrate, and a heat-treating device for heating said substrate to melt and bond the metal.

6. An apparatus according to claim 5, wherein said liner forming device further comprises a supplementary drying device for supplementarily drying the solvent in the ultrafine particle dispersed liquid supplied to the surface of said substrate.

7. An apparatus according to claim 3 or 4, further comprising a polishing device for chemical mechanical polishing the surface of the substrate to remove excessive metal attached thereto.

8. An apparatus according to claim 3 or 4, wherein said respective devices are sequentially arranged in an indoor facility along a direction in which the substrate moves.

9. An apparatus according to claim 3 or 4, wherein said respective devices are accommodated individually in respective chambers disposed radially around a central transfer chamber with a transfer robot disposed therein.

10. An apparatus for forming an interconnection, comprising:
    means for forming a liner on a surface of a substrate having a fine recess formed therein by reducing an organic metal compound in a non-aqueous salt; and
    means for electrolytically plating the surface of said substrate using said liner means.

11. An apparatus for forming an interconnection, comprising:
    means for forming a liner on a surface of a substrate having a fine recess formed therein by supplying an ultrafine particle dispersed liquid comprising ultrafine metal particles dispersed in a solvent to the surface of said substrate, and by baking the ultrafine particle dispersed liquid; and
    means for electrolytically plating the surface of said substrate using said liner forming means.

12. The apparatus of claim 11, wherein said liner forming means comprises a dispersed liquid supply means for supplying said ultrafine particle dispersed liquid to the surface of said substrate, and a heat-treating means for heating said substrate to melt and bond the metal.

13. The apparatus of claim 12, wherein said liner forming means further comprises a supplementary drying device for supplementarily drying the solvent in the ultrafine particle dispersed liquid supplied to the surface of said substrate.

* * * * *

UNITED STATES PATENT AND TRADEMARK OFFICE
CERTIFICATE OF CORRECTION

PATENT NO.    : 6,709,555 B1
DATED         : March 23, 2004
INVENTOR(S)   : Ogure et al.

It is certified that error appears in the above-identified patent and that said Letters Patent is hereby corrected as shown below:

Column 17,
Line 26, before "reducing" insert -- organic metal compound and said --

Signed and Sealed this

Twenty-fifth Day of May, 2004

JON W. DUDAS
*Acting Director of the United States Patent and Trademark Office*